United States Patent
Youk et al.

(10) Patent No.: US 10,504,849 B2
(45) Date of Patent: Dec. 10, 2019

(54) DISPLAY DEVICE AND METHOD FOR MANUFACTURING THE SAME

(71) Applicant: LG DISPLAY CO., LTD., Seoul (KR)

(72) Inventors: Seung-Hyun Youk, Paju-si (KR);
Soon-Sung Yoo, Goyang-si (KR);
Chul-Ho Kim, Paju-si (KR);
Nam-Kook Kim, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 939 days.

(21) Appl. No.: 14/579,494

(22) Filed: Dec. 22, 2014

(65) Prior Publication Data
US 2015/0179586 A1     Jun. 25, 2015

(30) Foreign Application Priority Data
Dec. 24, 2013    (KR) .................... 10-2013-0162175

(51) Int. Cl.
*H01L 23/544* (2006.01)
*G02F 1/1368* (2006.01)
(Continued)

(52) U.S. Cl.
CPC .......... *H01L 23/544* (2013.01); *G02F 1/1368* (2013.01); *G02F 1/13452* (2013.01); *G02F 1/133512* (2013.01); *H01L 51/5284* (2013.01); *G02F 2001/133354* (2013.01); *H01L 27/3276* (2013.01); *H01L 2223/54426* (2013.01);
(Continued)

(58) Field of Classification Search
CPC . G06F 3/00; H01L 23/00; H01L 27/00; G02F 1/13
See application file for complete search history.

(56) References Cited

U.S. PATENT DOCUMENTS

| | | | | |
|---|---|---|---|---|
| 6,403,401 B1 * | 6/2002 | Aquien | ............... | H01L 23/3128 |
| | | | | 257/E23.069 |
| 2005/0243253 A1 * | 11/2005 | Imai | ................... | G02B 27/2214 |
| | | | | 349/122 |

(Continued)

FOREIGN PATENT DOCUMENTS

| | | |
|---|---|---|
| CN | 102263117 A | 11/2011 |
| CN | 102681240 A | 9/2012 |

(Continued)

OTHER PUBLICATIONS

Biology as Poetry: Organic Chemistry. Amino Group. Obtained Nov. 13, 2017.*

(Continued)

*Primary Examiner* — Scott R. Walshon
*Assistant Examiner* — Sathavaram I Reddy
(74) *Attorney, Agent, or Firm* — Dentons US LLP (57) ABSTRACT

Disclosed is a method for forming a display device. The method includes forming an alignment mark on a front surface of a substrate having a display region and a non-display region surrounding the display region, forming an alignment protection pattern on a rear surface of the substrate such that the alignment protection pattern overlaps the alignment mark, and forming a light-shielding member in the non-display region on the rear surface of the substrate such that the light-shielding member forms a boundary with the alignment protection pattern.

9 Claims, 13 Drawing Sheets

(51) Int. Cl.
*H01L 27/32* (2006.01)
*G02F 1/1335* (2006.01)
*H01L 51/52* (2006.01)
*G02F 1/1345* (2006.01)
*G02F 1/1333* (2006.01)

(52) U.S. Cl.
CPC ............ *H01L 2223/54486* (2013.01); *H01L 2924/0002* (2013.01); *Y10T 428/24802* (2015.01)

(56) References Cited

U.S. PATENT DOCUMENTS

| | | | | |
|---|---|---|---|---|
| 2008/0017835 | A1* | 1/2008 | Takahashi | B82Y 30/00 252/519.12 |
| 2008/0273159 | A1* | 11/2008 | Seok | G02F 1/1347 349/158 |
| 2010/0182686 | A1* | 7/2010 | Fukushima | G02B 27/2214 359/463 |
| 2010/0289765 | A1* | 11/2010 | Noguchi | G02F 1/13338 345/173 |
| 2010/0309152 | A1* | 12/2010 | Kusuda | G02F 1/13338 345/173 |
| 2011/0134378 | A1* | 6/2011 | Tsuboi | G02F 1/133512 349/110 |
| 2011/0187981 | A1* | 8/2011 | Kurasawa | G02F 1/1339 349/153 |
| 2011/0291139 | A1 | 12/2011 | Chiu et al. | |
| 2012/0026107 | A1* | 2/2012 | Kim | G06F 3/044 345/173 |

FOREIGN PATENT DOCUMENTS

| | | |
|---|---|---|
| CN | 102799018 A | 11/2012 |
| JP | H08-6005 A | 1/1996 |
| JP | 2001-235738 A | 8/2001 |
| JP | 2005-326578 A | 11/2005 |

OTHER PUBLICATIONS

Data sheet on Vinyl and Vinylidene Chlorides. Obtained Nov. 13, 2017.*
https://www.freethesaurus.com/pattern (Obtained Nov. 16, 2017).*

* cited by examiner

DISPLAY DEVICE AND METHOD FOR MANUFACTURING THE SAME

This application claims the benefit of Korean Patent Application No. 10-2013-0162175, filed on Dec. 24, 2013, which is hereby incorporated by reference for all purposes as if fully set forth herein.

BACKGROUND OF THE INVENTION

Field of the Invention

The present invention relates to a display device and a method for manufacturing the same to prevent deterioration in visibility.

Discussion of the Related Art

Flat panel displays for displaying an image include liquid crystal displays (LCDs), plasma display panels (PDPs), field emission displays (FEDs), organic light emitting diodes (OLEDs), electrophoretic displays (EPDs) and the like.

The flat display devices include a display region for displaying an image and a non-display region formed around the display region. In particular, a plurality of outer signal lines for supplying a driving signal to the display region are formed in the non-display region. Upon receiving exterior light, the outer signal lines reflect the light, causing deterioration in visibility. When a bezel region where the outer signal lines are formed is shielded by a light-shielding member or the like in order to prevent deterioration in visibility, at least a part of an alignment mark disposed in the bezel region is shielded by the light-shielding member. Accordingly, disadvantageously, visibility of the alignment mark is deteriorated and accuracy of the subsequent process using the alignment mark is thus deteriorated.

SUMMARY OF THE INVENTION

Accordingly, the present invention is directed to a display device and a method for manufacturing the same that substantially obviate one or more problems due to limitations and disadvantages of the related art.

An object of the present invention is to provide a display device and a method for manufacturing the same to prevent deterioration in visibility.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a method for manufacturing a display device includes forming an alignment mark on a front surface of a substrate having a display region and a non-display region surrounding the display region, forming an alignment protection pattern to overlap the alignment mark on a rear surface of the substrate, and forming a light-shielding member in the non-display region on the rear surface of the substrate, wherein the light-shielding member forms a boundary with the alignment protection pattern.

The alignment protection pattern and the light-shielding member may be continuously formed using an identical inkjet device.

In accordance with another aspect of the present invention, provided is display device including a substrate having a display region and a non-display region surrounding the display region, an alignment mark formed in the non-display region on a front surface of the substrate, a light-shielding member formed in the non-display region on a rear surface of the substrate, and an alignment protection pattern formed on the rear surface of the substrate, wherein the alignment protection pattern overlaps the alignment mark and forms a boundary with the light-shielding member.

Any one of the alignment protection pattern and the light-shielding member may be formed of a hydrophilic material and the other is formed of a hydrophobic material.

The hydrophilic material may include a substance having a terminal group selected from —OH, —CO$_2$H (carboxyl group), —NH$_2$ (amino group), —SH (thiol group) and —CONH$_2$ (amide group), and the hydrophobic material may include a substance having a terminal group selected from —Cl, —F, —CH$_3$ (alkyl group), and —C$_6$H$_5$ (phenyl group).

The display device may further include an optical film adhered to the rear surface of the substrate, based on the alignment mark.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and simultaneously with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the annexed drawings and examples.

Figure 1:
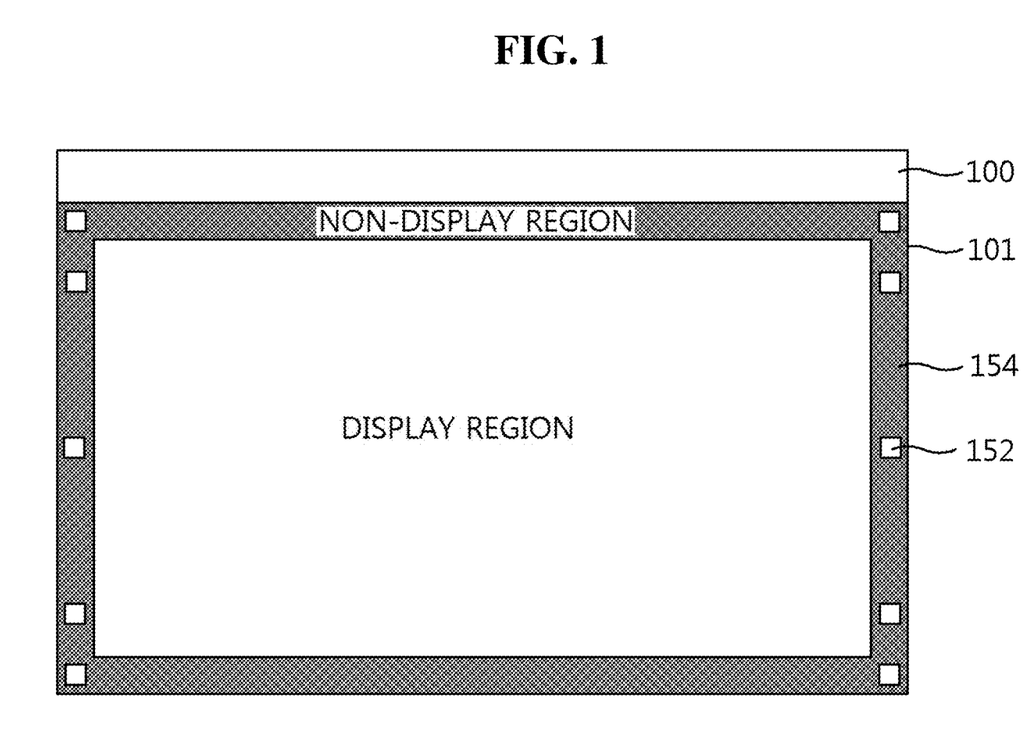
FIG. 1 is a plan view illustrating a display device according to the present invention.
Figure 2:
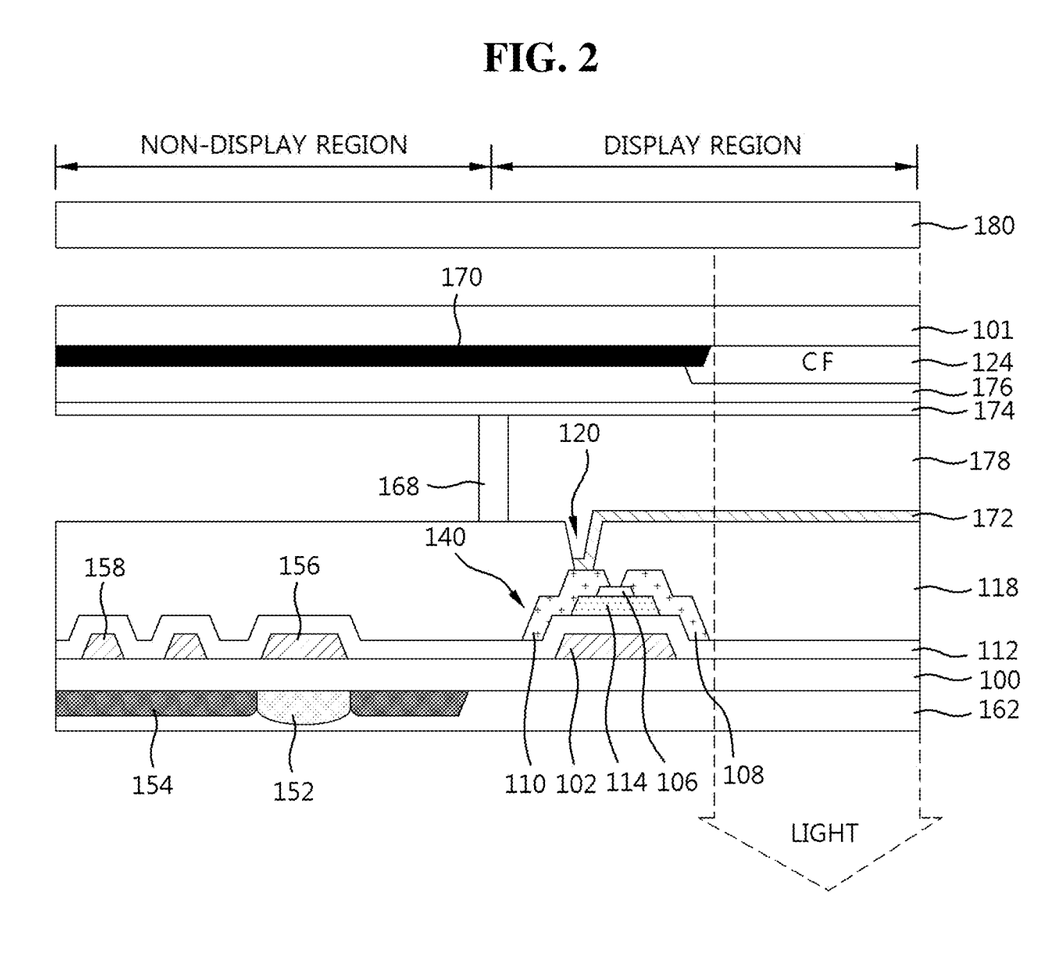
FIG. 2 is a sectional view illustrating the display device shown in FIG. 1.

FIG. 1 is a plan view illustrating a display device according to the present invention and FIG. 2 is a sectional view illustrating the display device shown in FIG. 1. In FIG. 1 and FIG. 2, a liquid crystal display device is exemplarily described as the display device.

The display device shown in FIGS. 1 and 2 includes a display region and a non-display region excluding the display region.

The display region is provided with an upper substrate 101 and a lower substrate 100 which are joined by a joining member 168 such that a liquid crystal layer 178 is interposed therebetween.

A color filter 124 for rendering color, a black matrix 170 for preventing light leakage, an over-coat layer 176 for planarization, and a common electrode 174 forming an electric field with the pixel electrode 172 are formed on the upper substrate 101.

A gate line and a data line crossing each other, a thin film transistor 140 formed at the crossing thereof, and a pixel electrode 172 connected to the thin film transistor 140 on a protective film 118 are formed on the lower substrate 100. Here, as shown in FIG. 2, the thin film transistor 140 includes a gate electrode 102 formed on a lower substrate 100 such that it is connected to the gate line, a gate insulation film 112 covering the gate electrode 102, an oxide semiconductor layer 114 overlapping the gate electrode 102 via the gate insulation film 112, an etch stopper 106 formed on the oxide semiconductor layer 114 to prevent damage to the oxide semiconductor layer 114, a source electrode 108 connected to the data line, and a drain electrode 110 facing the source electrode 108. Here, the oxide semiconductor layer 114 is formed of an oxide containing at least one metal selected from Zn, Cd, Ga, In, Sn, Hf and Zr.

In the display region, light emitted from a front light unit 180 formed on an upper surface of the upper substrate 101 passes through the liquid crystal layer 178 and is then discharged to the bottom of the lower substrate 100 to display an image.

The non-display region is a bezel region which is preferably as narrow as possible so that the display region can be relatively widely formed. For this purpose, the non-display region has a four-surface borderless structure having no step in which a step caused by a cover or the like is not formed on the surface of the lower substrate 100 on which an image is displayed, because four surfaces of the non-display region are not surrounded by an upper or lower cover or the like.

In the non-display region, a plurality of outer signal lines 158, a light-shielding member 154, an alignment mark 156 and an alignment protection pattern 152 are formed.

The outer signal lines 158 are connected to the gate and data lines formed in the display region and supply a driving signal to the gate and data lines. The outer signal lines 158 are formed as a line-on-glass type on the upper surface of the lower substrate 100.

The light-shielding member 154 is formed of a black material such that it overlaps the outer signal lines 158 on the bottom of the lower substrate 100. The light-shielding member 154 shields light of the bezel region provided with the outer signal lines 158, thereby preventing deterioration in visibility caused by the outer signal lines 158 reflecting (exterior) light.

The alignment mark 156 is formed on the lower substrate 100 for accurate alignment of an optical film 162 formed on the bottom of the lower substrate 100 with the lower substrate 100. The alignment mark 156 is formed on the same layer and using the same material as at least one of gate and data lines formed on the lower substrate 100.

The alignment protection pattern 152 is formed of a material having a polarity opposite to that of the light-shielding member 154 on the bottom of the lower substrate 100 such that it overlaps the alignment mark 156. That is, when the light-shielding member 154 is formed of a hydrophilic black ink, the alignment protection pattern 152 is formed of a hydrophobic ink and, when the light-shielding member 154 is formed of a hydrophobic black ink, the alignment protection pattern 152 is formed of a hydrophilic ink. For example, any one of the light-shielding member 154 and the alignment protection pattern 152 has a terminal group of a substance such as —Cl, —F, —CH$_3$ (alkyl group) or —C$_6$H$_5$ (phenyl group) and is thus hydrophobic and the other has a terminal group formed of —OH, —CO$_2$H (carboxyl group), —NH$_2$ (amino group), —SH (thiol group) or —CONH$_2$ (amide group) and is thus hydrophilic.

As such, a repulsive force is generated between the light-shielding member 154 and the alignment protection pattern 152 having different polarities. Accordingly, the light-shielding member 154 surrounds the alignment protection pattern 152 while not overlapping the alignment protection pattern 152 so that the light-shielding member 154 forms a boundary with the alignment protection pattern 152. The light-shielding member 154 forming the boundary with the alignment protection pattern 152 prevents overlap with the alignment mark 156 and thus visibility deterioration of the alignment mark 156 by the light-shielding member 154. Accordingly, adhesion of the optical film 162 aligned based on the alignment mark 156 is easy, and the alignment mark 156 is visible from the outside by the alignment protection pattern 152 while not overlapping the light-shielding member 154, although the size of the alignment mark 156 is smaller (more specifically, at least 40 μm), than in a conventional case.

Meanwhile, the alignment protection pattern 152 is formed of a transparent or non-transparent material. When the alignment protection pattern 152 is formed of a transparent material, the alignment mark 156 is visible from the outside and the optical film 162 is aligned based on the alignment mark 156. In addition, when the alignment protection pattern 152 is formed of a non-transparent material, the alignment protection pattern 152 is visible from the outside and the optical film 162 is aligned based on the alignment protection pattern 152.

Figure 3:
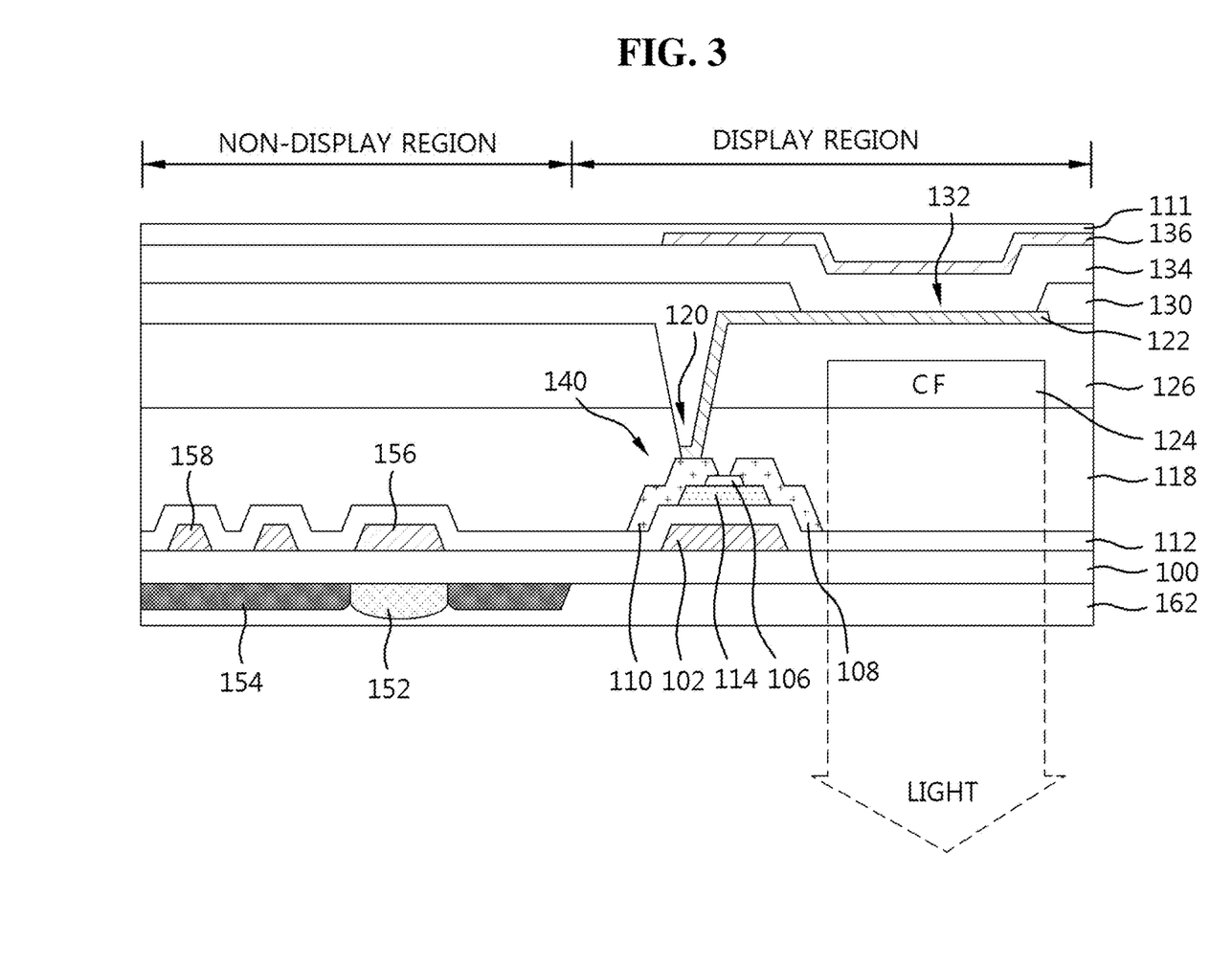
FIG. 3 is a sectional view illustrating an organic light emitting display according to another embodiment of the present invention.

Meanwhile, although the liquid crystal display device is exemplarily described in FIGS. 1 and 2, the present invention is applicable to an organic light emitting display, as shown in FIG. 3.

That is, the organic light emitting display shown in FIG. 3 includes a first electrode 122 connected to the thin film transistor 140, a bank hole insulation film 130 provided with a bank hole 132 for exposing the first electrode 122, an organic light emitting layer 134 formed on the first electrode 122, a second electrode 136 formed on the organic light emitting layer 134 and a color filter 124 for rendering color.

The organic light emitting layer 134 is formed on the first electrode 122 exposed by the bank hole 132 provided in the bank hole insulation film 130 for dividing sub-pixels disposed in the display region and the bank hole insulation film 130. The organic light emitting layer 134 has a structure in which a hole transport layer, a light emitting layer and an electron transport layer are stacked in a forward or reverse order on the first electrode 122. In particular, in the light emitting layer, holes supplied through the hole transport layer recombine with electrons supplied through the electron transport layer, to generate white light.

The color filter 124 is formed on the protective film 118 in the display region and renders color of the corresponding sub-pixel using white light from the organic light emitting layer 134.

The first electrode 122 is an anode which is formed of a transparent conductive material such as ITO on the over-coat layer 126. The first electrode 122 transmits light generated by the organic light emitting layer 134 and emits the same to the bottom of the lower substrate.

The second electrode 136 is a cathode which is formed of a reflective metal material such as aluminum (Al) on the bank hole insulation film 130. The second electrode 136 functions as a reflective electrode for reflecting light, which is generated in the organic light emitting layer 134 and travels to the capping layer 111, toward the first electrode 122.

Accordingly, when a voltage is applied across the first electrode 122 and the second electrode 136, light, which is generated in the organic light emitting layer 134 and passes through the color filter 124, is emitted to the bottom of the lower substrate 100.

A plurality of outer signal lines 158 for supplying a driving signal to the gate line and data line, a light-shielding member 154 for shielding the bezel region provided with the outer signal lines 158, an alignment mark 156 for accurate alignment of the lower substrate 100 and the optical film 162 and an alignment protection pattern 152 having an opposite polarity to the light-shielding member 154 are formed in the non-display region.

The light-shielding member 154 forms a boundary with the alignment protection pattern 152 because repulsive force is generated between the light-shielding member 154 and the alignment protection pattern 152 having different polarities formed in the non-display region. The light-shielding member 154 forming the boundary with the alignment protection pattern 152 prevents overlap with the alignment mark 156 and thus visibility deterioration of the alignment mark 156 by the light-shielding member 154.

Figure 4A:
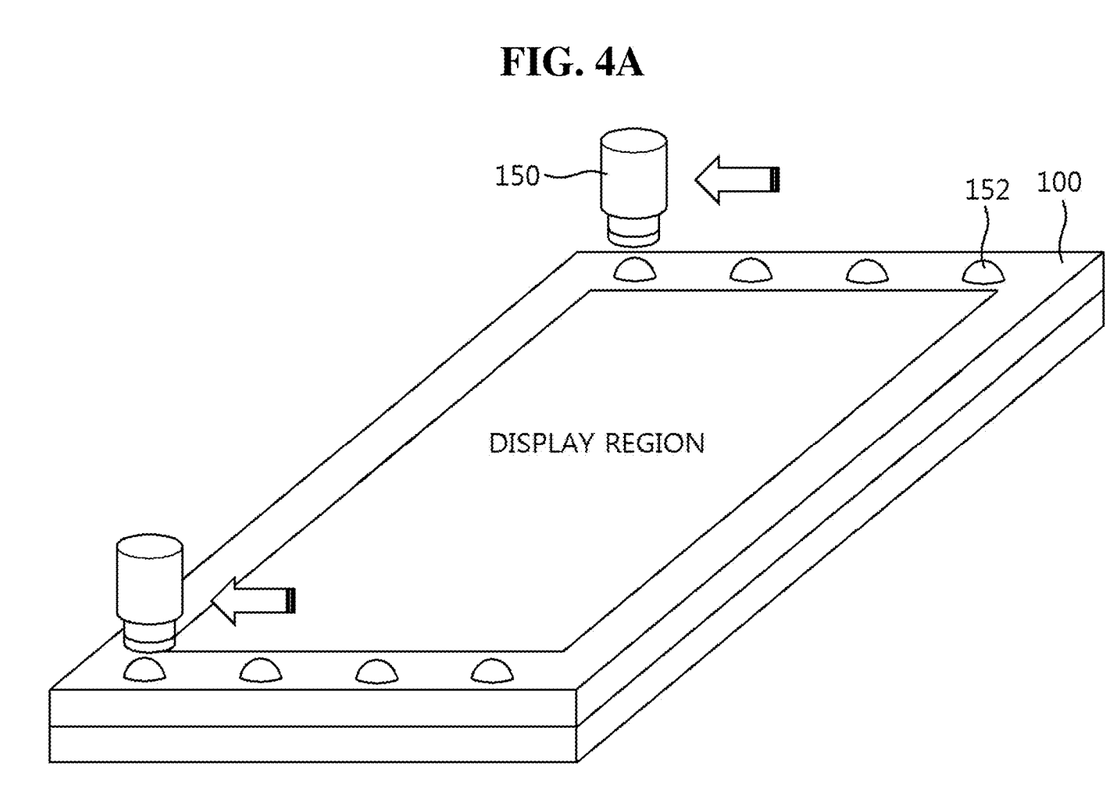
FIGS. 4A and 4B are views illustrating a method for manufacturing the alignment protection pattern shown in FIG. 3.
Figure 5A:
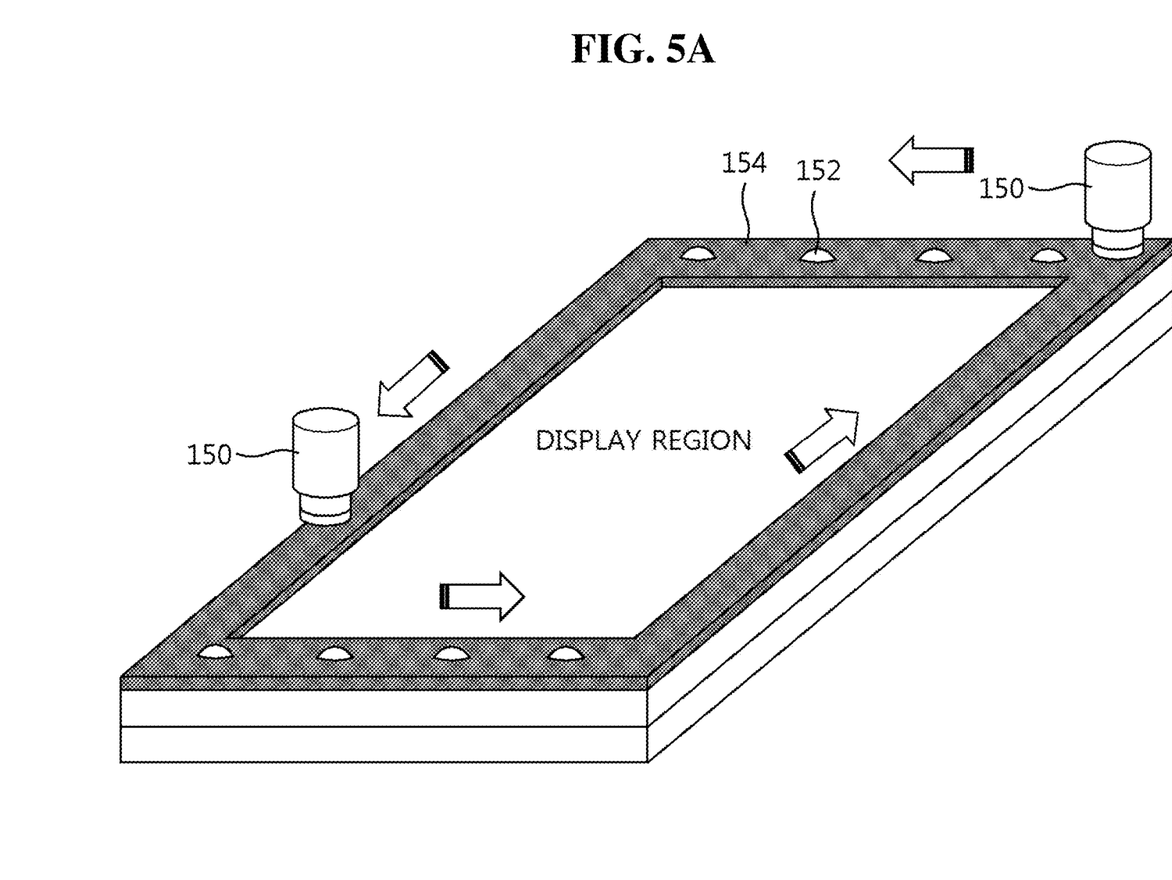
FIGS. 5A and 5B are views illustrating a method for manufacturing the light-shielding member shown in FIG. 3.
Figure 5B:
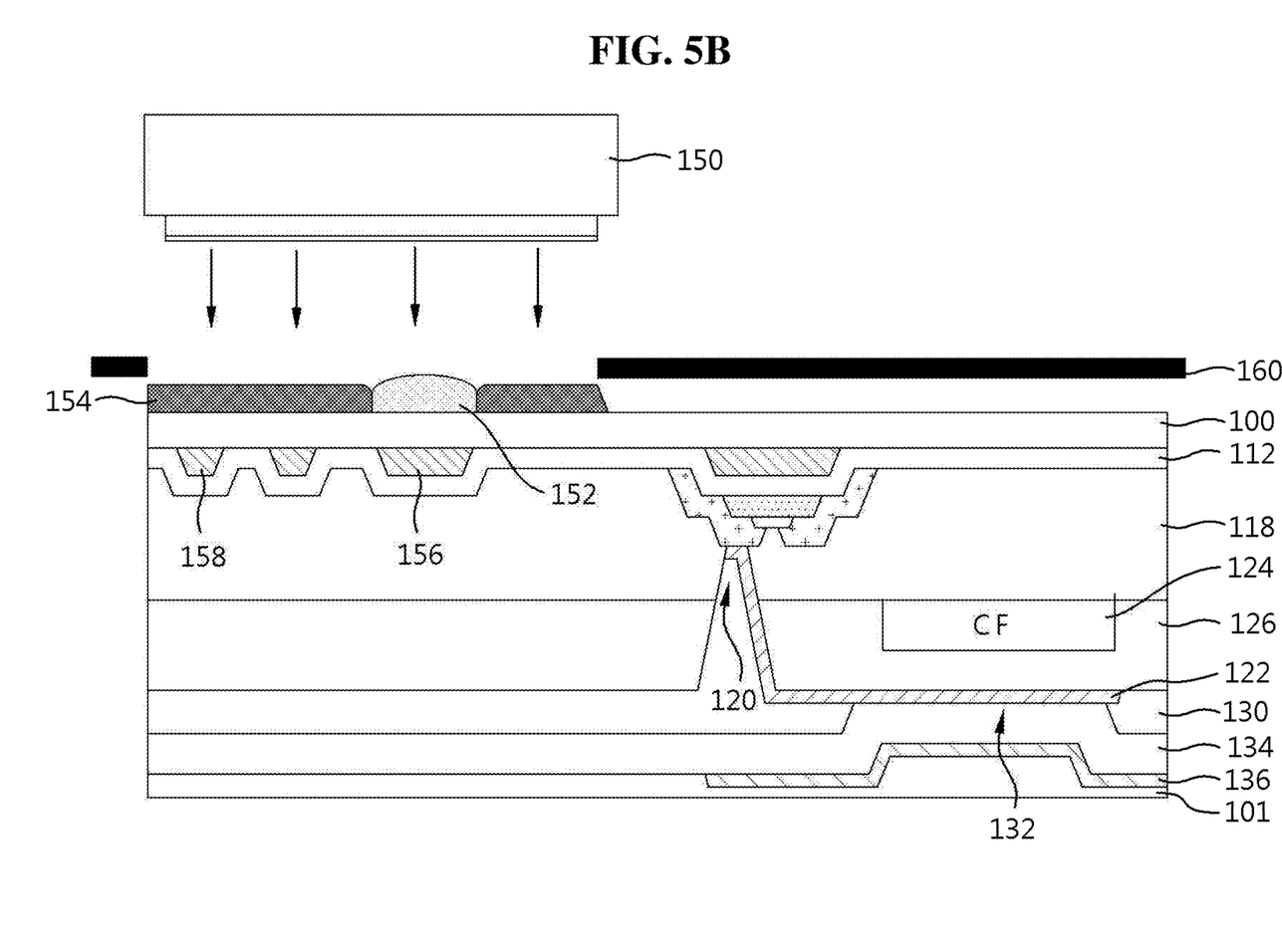
Figure 6A:
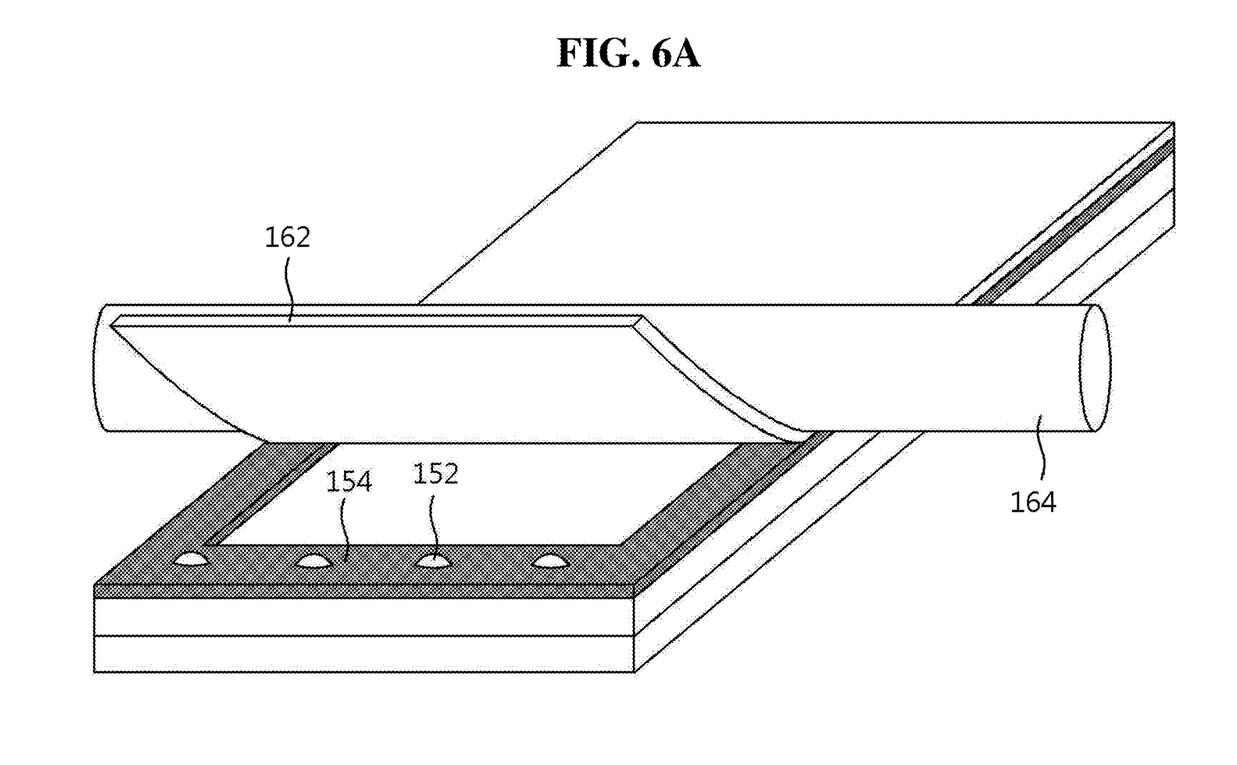
FIGS. 6A and 6B are views illustrating a method for manufacturing the optical film shown in FIG. 3.
Figure 6B:
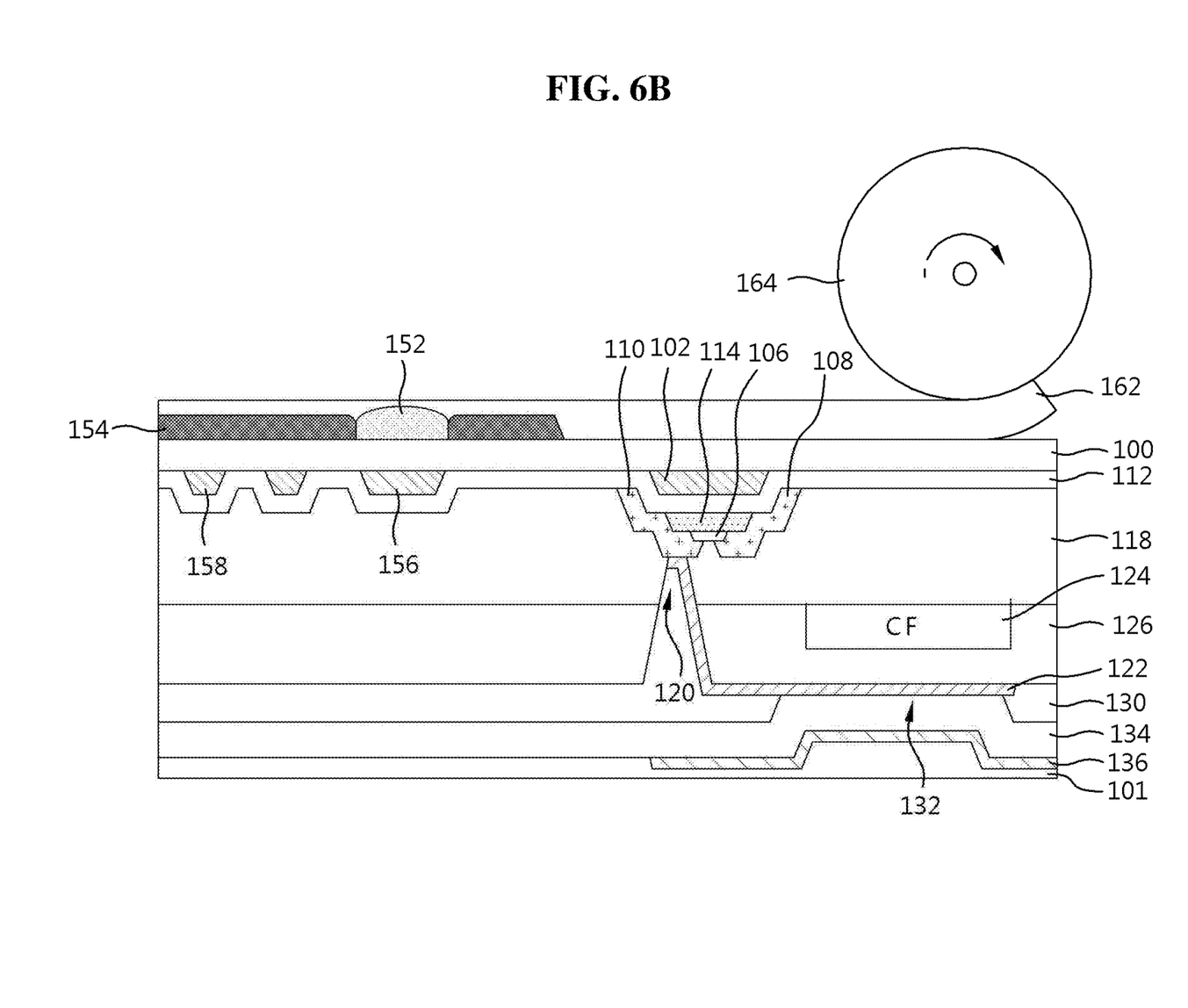

FIGS. 4A and 6B are views illustrating a method for manufacturing the display device according to the present invention. In FIGS. 4A and 6B, the organic light emitting display shown in FIG. 3 is exemplarily described.

Figure 4B:
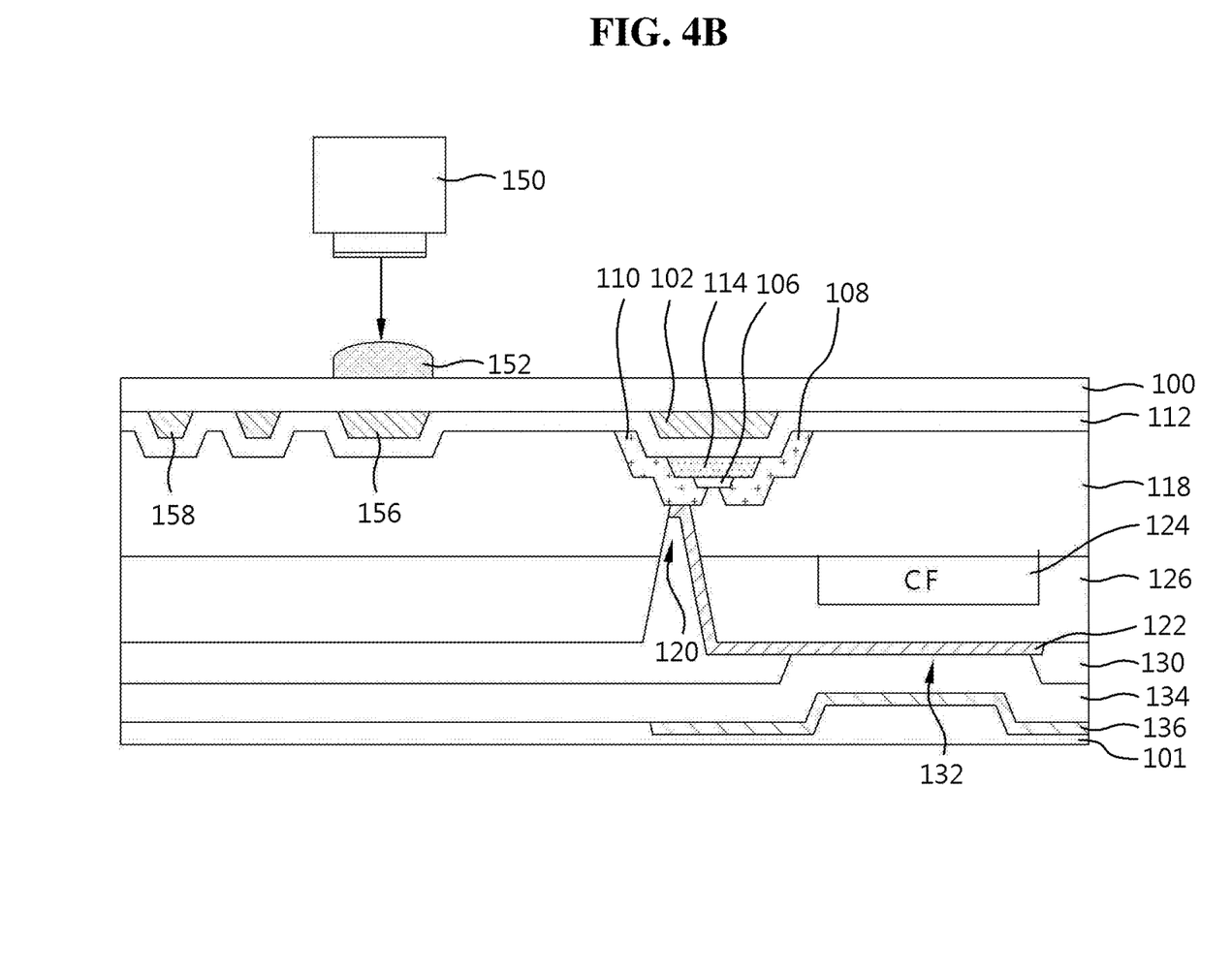

Referring to FIGS. 4A and 4B, an alignment protection pattern 152 is formed on the bottom of the lower substrate 100 of a display panel.

Specifically, an inkjet device 150 is aligned on the bottom of the lower substrate 100. The aligned inkjet device 150 jets an alignment ink on the bottom of the lower substrate 100 while moving in a lateral direction. The dropped alignment ink is heat-cured or photo-cured to form an alignment protection pattern 152 on the bottom of the lower substrate 100 such that it overlaps the alignment mark 156.

Referring to FIGS. 5A and 5B, a light-shielding member 154 is formed on the bottom of the lower substrate 100 provided with the alignment protection pattern 152.

Specifically, the inkjet device 150 aligned on the bottom of the lower substrate 100 provided with the alignment protection pattern 152 jets black ink while moving along the bezel region. In this case, in consideration of spreading of the black ink, the black ink may be dropped on the bottom of the lower substrate 100 using a shadow mask 160. That is, the black ink is dropped on the bottom of the lower substrate 100 using the shadow mask 160 to prevent the black ink from diffusing into the display region, when the black ink has excellent spreadability. In addition, the black ink is dropped on the bottom of the lower substrate 100 without the shadow mask 160, when the black ink has low spreadability. The dropped black ink is heat-cured or photo-cured, thereby forming a light-shielding member 154 creating a boundary with the alignment protection pattern 152. In this case, the alignment mark can be seen by the alignment protection pattern 152 forming the boundary with the light-shielding member 154 while not overlapping the same.

The light-shielding member 154 is formed of a material having an opposite polarity to that of the alignment protection pattern 152. That is, when the alignment protection pattern 152 is formed of a hydrophilic alignment ink, the light-shielding member 154 is formed of a hydrophobic black ink and, when the alignment protection pattern 152 is formed of a hydrophobic alignment ink, the light-shielding member 154 is formed of a hydrophilic black ink.

Meanwhile, the light-shielding member 154 can be formed using the same inkjet device 150 as the alignment protection pattern 152 and a continuous process can thus be performed in the same apparatus.

Referring to FIGS. 6A and 6B, the optical film 162 is formed on the bottom of the lower substrate 100 provided with the light-shielding member 154.

Specifically, the optical film 162 is accurately aligned on the bottom of the lower substrate 100 based on the alignment mark 156. Then, an optical film 162 is adhered to the entire surface of the bottom of the lower substrate 100 using a pressing roller 164. Here, the optical film 162 is, for example, formed of at least one of a polarizing plate, a phase-difference plate and a film pattern retarder.

Meanwhile, in a conventional case having no alignment protection pattern, there is a great difference in height between the light-shielding member and the substrate. In this case, upon adhesion of the optical film, bubbles are generated between the light-shielding member and the substrate, and the optical film is not adhered well and is separated and is thus not clearly seen. Accordingly, in a conventional case, recognition of the alignment mark and align accuracy are disadvantageously deteriorated.

On the other hand, the present invention provided with the alignment protection pattern 152 prevents generation of bubbles upon adhesion of the optical film 162, because the light-shielding member 154 has a similar height to that of the alignment protection pattern 152. Accordingly, the present invention provides improved recognition of the alignment mark 156 and improved alignment accuracy than in the conventional case.

Meanwhile, the present invention suggests formation of the alignment protection pattern 152 in order to expose the alignment mark 156 used upon adhesion of the optical film 162, but this is equally applicable upon formation of the thin film pattern in the display panel.

Figure 7A:
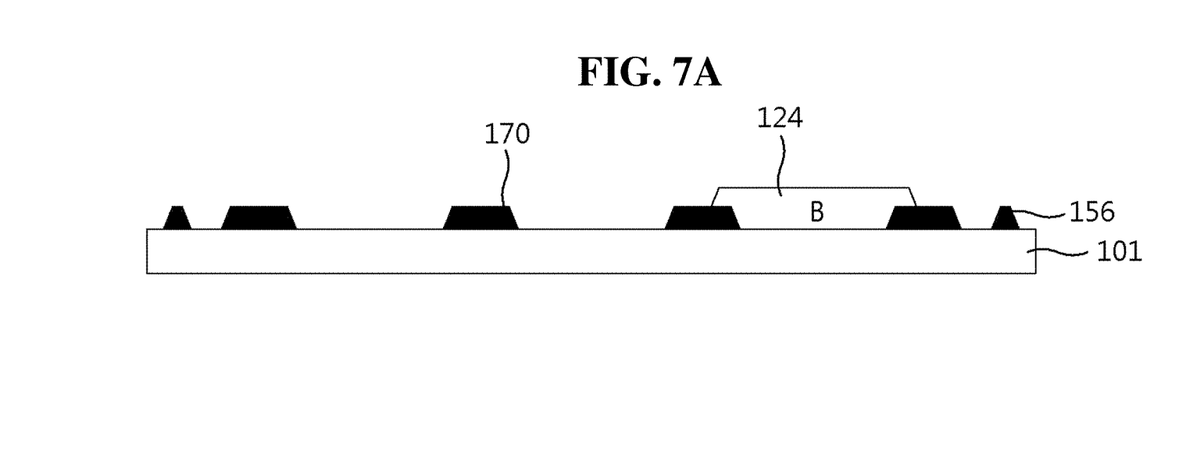
FIGS. 7A to 7D are views illustrating application of the alignment protection pattern shown in FIG. 2 to the display panel.
Figure 7B:
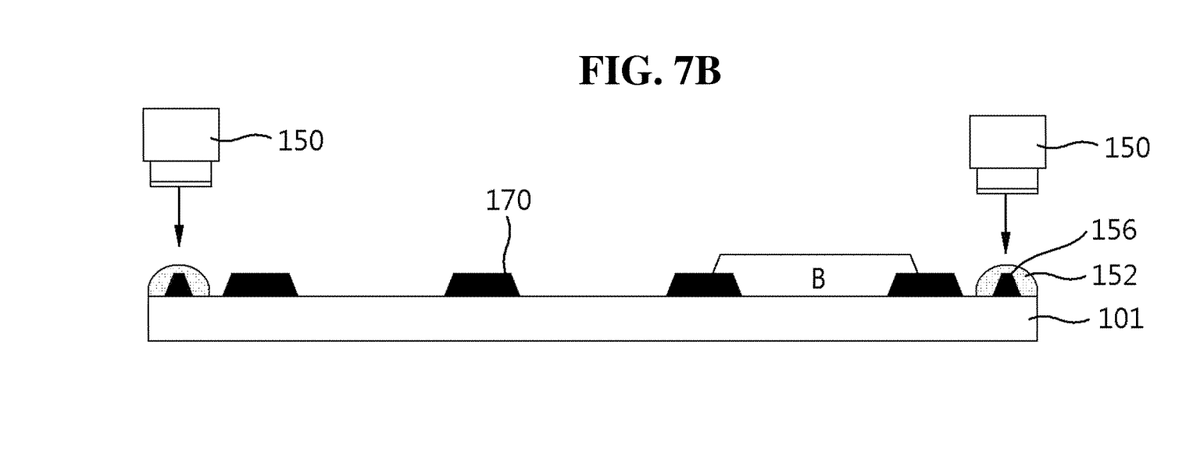
Figure 7C:
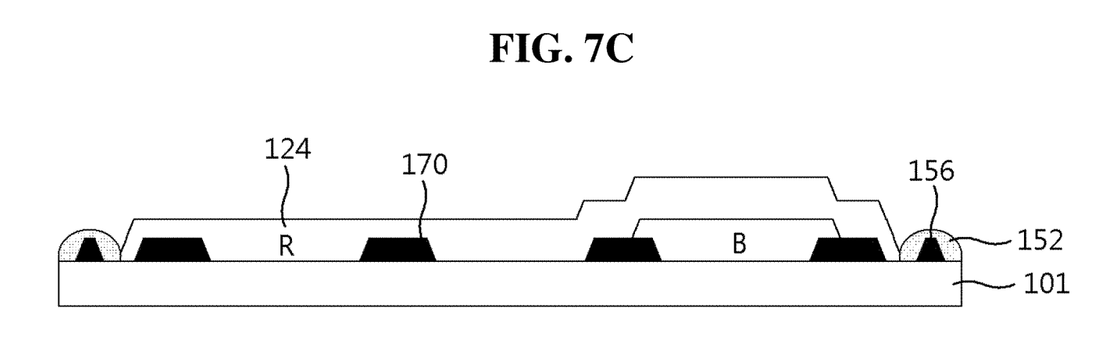
Figure 7D:
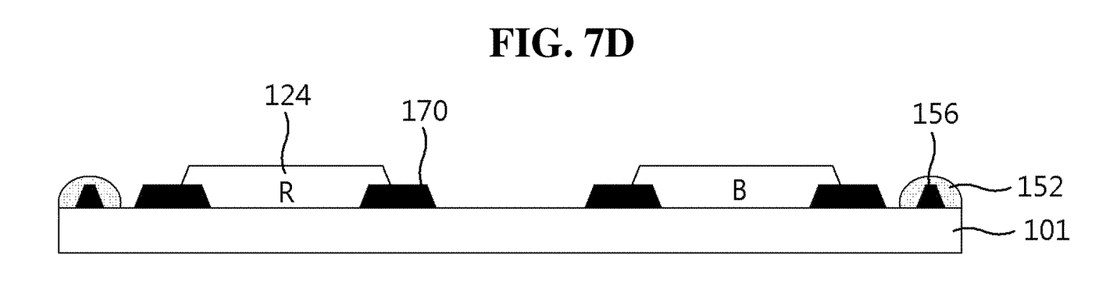

Specifically, as shown in FIG. 7A, a blue B color filter 124 is formed on the upper substrate 101 provided with the black matrix 170 and the alignment mark 156. Then, as shown in FIG. 7B, a hydrophobic or hydrophilic ink is dropped on the alignment mark 156 using the inkjet device 150 to form an alignment protection pattern 152 covering the alignment mark 156. Then, as shown in FIG. 7C, a red R color ink having an opposite polarity to the alignment protection pattern 152 is entirely coated by screen printing, slot die coating or spin coating to form the red R color ink in a region excluding the alignment protection pattern 152. Then, a photomask is aligned on the upper substrate 101 provided with the red R color ink, based on the alignment mark 156 exposed by the alignment protection pattern 152. The red R color ink is patterned by light exposure and development using the photomask to form a red color filter 124, as shown in FIG. 7.

Meanwhile, the present invention suggests an example in which the alignment mark 156 is exposed through the alignment protection pattern 152 formed of an ink having a different polarity from the light-shielding member 154 while not overlapping the light-shielding member 154. Further, when the bottom of the lower substrate 100 overlapping the alignment mark 156 is surface-treated to a polarity opposite to the light-shielding member 154, the surface-treated bottom of the lower substrate 100 functions as the alignment protection pattern 152, thus preventing deterioration in visibility of the alignment mark 156.

Figure 8A:
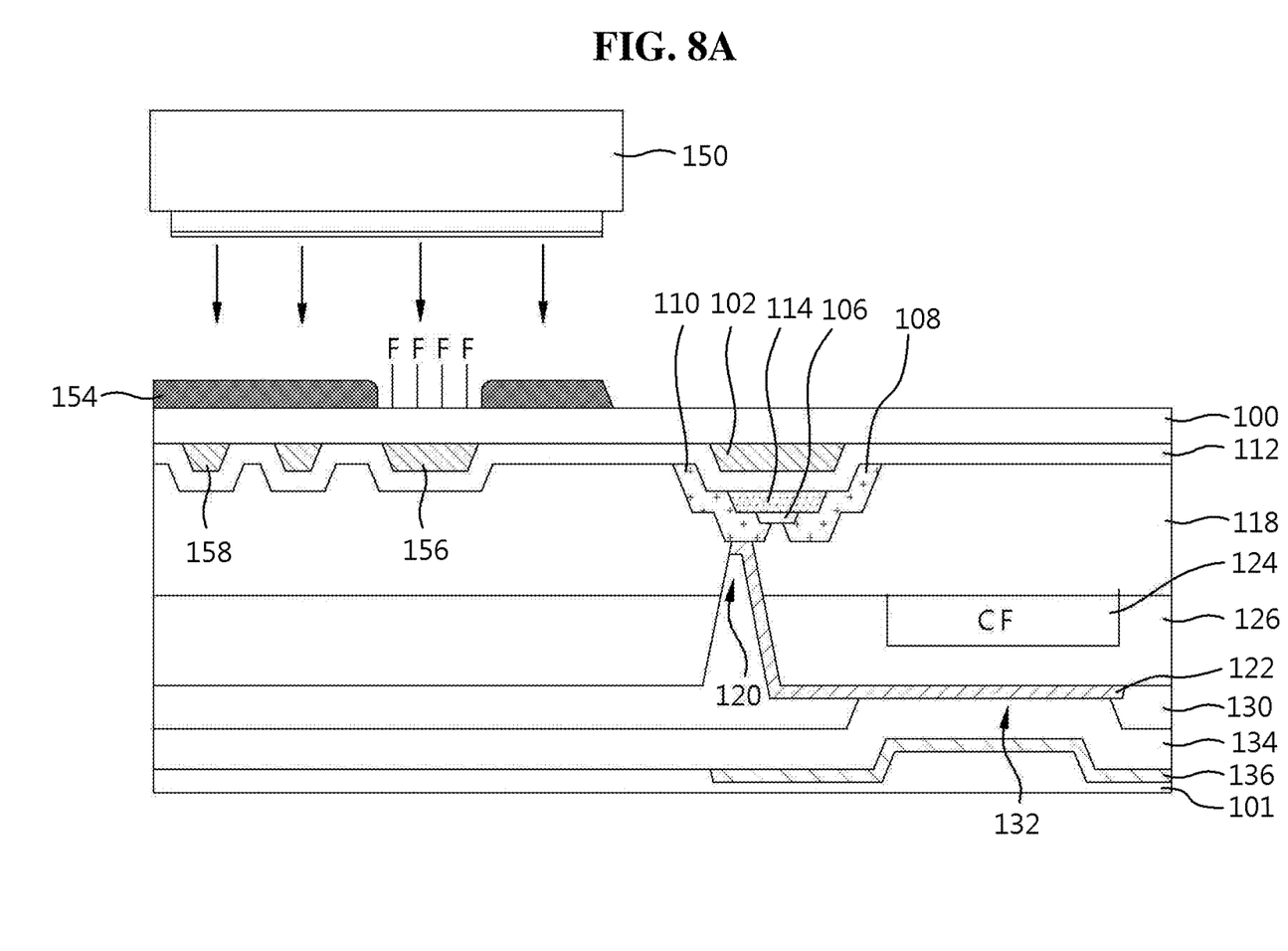
FIGS. 8A and 8B are sectional views illustrating an organic light emitting display according to another embodiment of the present invention.

That is, as shown in FIG. 8A, the bottom of the lower substrate 100 overlapping the alignment mark 156 is plasma-treated using at least one of SF6 and CF4 containing fluorine, thereby selectively imparting hydrophobicity to the surface of the bottom of the lower substrate 100 overlapping the alignment mark 156. Accordingly, the light-shielding member 154 formed of a hydrophilic material is formed in a non-display region excluding the hydrophobic region such that it does not overlap the light-shielding member 154, thereby preventing deterioration in visibility of the alignment mark 156.

Figure 8B:
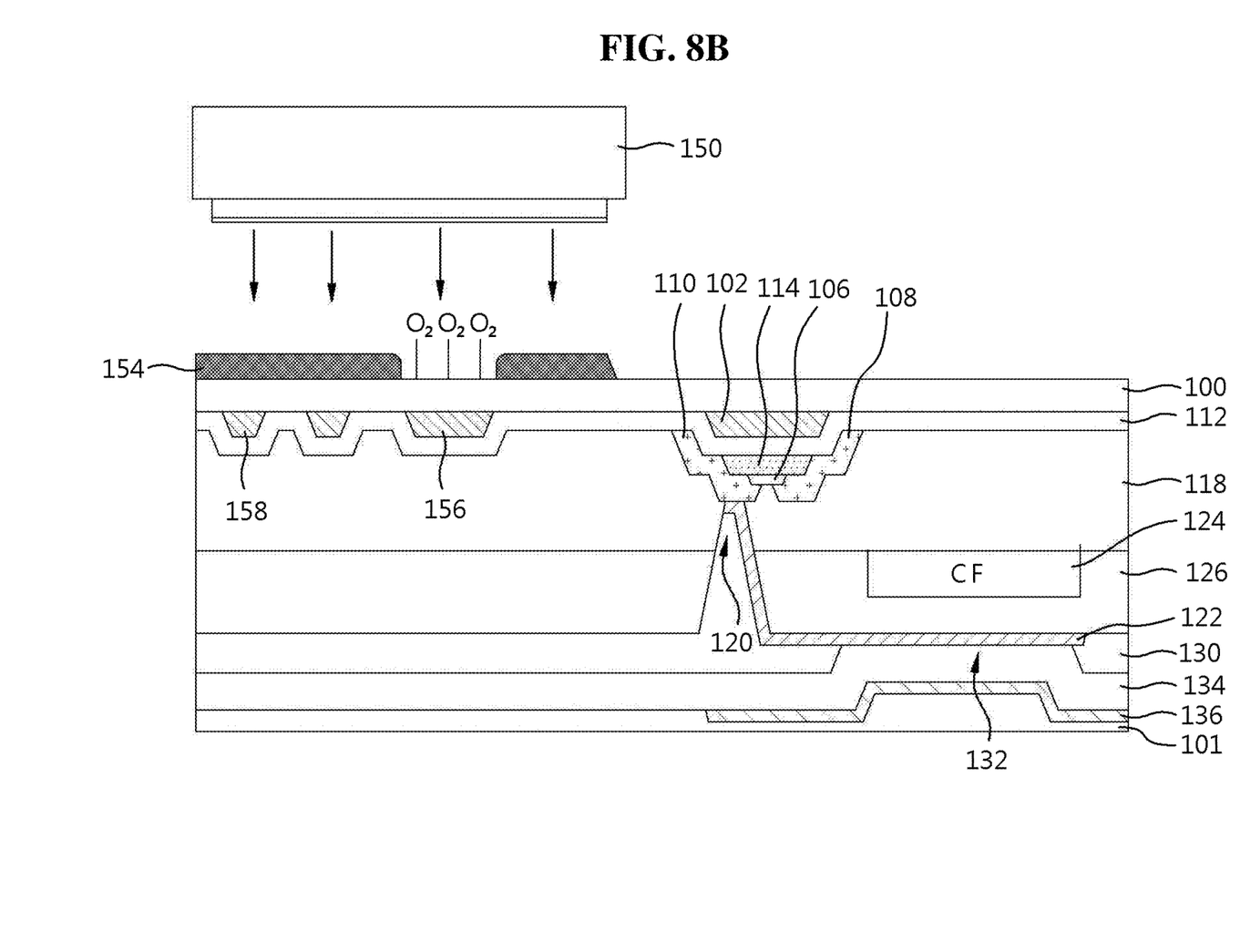

In addition, as shown in FIG. 8B, the bottom of the lower substrate 100 overlapping the alignment mark 156 is treated with $O_2$ plasma, thereby selectively imparting hydrophilicity to the surface of the lower substrate 100 overlapping the alignment mark 156. Accordingly, the light-shielding member 154 formed of a hydrophobic material is formed in a non-display region excluding the hydrophilic region such that it does not overlap the light-shielding member 154, thereby preventing deterioration in visibility of the alignment mark 156.

As apparent from the foregoing, according to the present invention, an alignment protection pattern having a different polarity from a light-shielding member formed in a bezel region forms a boundary with the light-shielding member while not overlapping the light-shielding member. Accordingly, deterioration in visibility of the alignment mark overlapping the alignment protection pattern can be prevented and a process of adhering the optical film aligned based on the alignment mark is easy. In addition, although the size of alignment mark is smaller than in a conventional case, a metal reflection area in the alignment mark region is decreased and visibility of the alignment mark is thus improved. In addition, the alignment protection pattern has a similar height to the light-shielding member, thus preventing generation of bubbles and separation (floating) of the optical film.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed:

1. A display device comprising:
    a substrate having a display region and a non-display region surrounding the display region;
    an alignment mark formed in the non-display region on a front surface of the substrate;
    a light-shielding member formed in the non-display region on a rear surface of the substrate; and
    a plurality of alignment protection patterns formed on the rear surface of the substrate,
    wherein one of the alignment protection patterns overlaps the alignment mark, forms a boundary with the light-shielding member and does not overlap with the light-shielding member, and
    wherein the light-shielding member is disposed between the plurality of alignment protection patterns, and encloses and borders an entire edge of each alignment protection pattern having an island shape.

2. The display device according to claim 1, wherein any one of the alignment protection patterns and the light-shielding member is formed of a hydrophilic material and the other is formed of a hydrophobic material.

3. The display device according to claim 2, wherein the hydrophilic material comprises a substance having a terminal group selected from —OH, —$CO_2$H (carboxyl group), —$NH_2$ (amino group), —SH (thiol group) and —$CONH_2$ (amide group), and
    the hydrophobic material comprises a substance having a terminal group selected from —Cl, —F, —$CH_3$ (alkyl group), and —$C_6H_5$ (phenyl group).

4. The display device according to claim 1, further comprising an optical film adhered to the rear surface of the substrate, based on the alignment mark.

5. The display device according to claim 1, further comprising outer signal lines, which provide driving signals to gate lines and data lines in the display region, in the non-display region on the front surface of the substrate.

6. The display device according to claim 5, wherein the alignment mark is formed of a same material as one of the gate lines and the data lines in the display region.

7. The display device according to claim 1, wherein the alignment protection patterns overlap the alignment mark, with the non-display region of the substrate therebetween.

8. The display device according to claim 5, wherein the light-shielding member overlaps the outer signal lines outside the alignment mark, with the non-display region of the substrate therebetween.

9. The display device according to claim 1, wherein the light-shielding member is in contact with an entire edge of each alignment protection pattern having the island shape in the non-display region.

* * * * *